(12) United States Patent
Ishibashi

(10) Patent No.: US 6,942,892 B1
(45) Date of Patent: Sep. 13, 2005

(54) HOT ELEMENT CVD APPARATUS AND A METHOD FOR REMOVING A DEPOSITED FILM

(75) Inventor: Keiji Ishibashi, Tokyo (JP)

(73) Assignee: Anelva Corporation, Tokyo (JP)

( * ) Notice: Subject to any disclaimer, the term of this patent is extended or adjusted under 35 U.S.C. 154(b) by 0 days.

(21) Appl. No.: 09/633,002

(22) Filed: Aug. 4, 2000

(30) Foreign Application Priority Data

Aug. 5, 1999 (JP) ................................. 11-222088

(51) Int. Cl.$^7$ .................. B05D 7/22; C23C 16/448; B08B 9/00
(52) U.S. Cl. .............. 427/237; 427/248.1; 427/255.28; 427/235; 134/22.1; 216/37; 216/63; 118/723 HC
(58) Field of Search ................ 427/561, 562, 427/569, 570, 573, 230, 237, 248.1, 299.28, 427/444, 235, 255.23, 585, 255.28; 118/715, 118/723 R, 723 HC, 70, 722; 134/1–1.3, 134/22.1, 37, 19; 216/37, 58, 63

(56) References Cited

U.S. PATENT DOCUMENTS

| | | | | |
|---|---|---|---|---|
| 4,450,031 A | * | 5/1984 | Ono et al. | 156/345.39 |
| 4,452,642 A | * | 6/1984 | Dietz et al. | 134/1 |
| 5,149,375 A | * | 9/1992 | Matsuyama | 118/719 |
| 5,216,241 A | * | 6/1993 | Hatakeyama et al. | 250/251 |
| 5,221,427 A | * | 6/1993 | Koinuma et al. | 216/67 |
| 5,637,153 A | * | 6/1997 | Niino et al. | 134/22.11 |
| 5,709,757 A | * | 1/1998 | Hatano et al. | 134/22.14 |
| 6,101,972 A | * | 8/2000 | Bluck et al. | 118/723 MP |
| 6,107,197 A | * | 8/2000 | Suzuki | 438/677 |
| 6,192,897 B1 | * | 2/2001 | Klebanoff et al. | 134/1.1 |
| 6,235,951 B1 | * | 5/2001 | Sakyu et al. | 570/156 |
| 6,375,756 B1 | * | 4/2002 | Ishibashi | 134/19 |
| 6,410,454 B1 | * | 6/2002 | Muranaka et al. | 438/758 |
| 6,592,771 B1 | * | 7/2003 | Yamanaka et al. | 216/63 |

FOREIGN PATENT DOCUMENTS

| | | | |
|---|---|---|---|
| JP | 03-226578 A | * | 10/1991 |
| JP | 06-338491 A | | 12/1994 |
| JP | 08-241865 A | | 9/1996 |
| JP | 09-045623 A | | 2/1997 |
| JP | 10-083988 A | | 3/1998 |
| JP | 11-054441 A | | 2/1999 |

* cited by examiner

Primary Examiner—Timothy Meeks
Assistant Examiner—Wesley D. Markham
(74) Attorney, Agent, or Firm—Baker & Daniels

(57) ABSTRACT

The present invention provides a method for efficiently and completely removing a film deposited inside a film forming chamber. In addition, the invention provides a CVD apparatus using heating element which an in-situ cleaning method can be applied and its in-situ leaning method.

The removal method of this invention comprises a method for removing a film deposited inside a chamber which can be exhausted and/or on a member placed in the chamber, wherein after the chamber is exhausted, a heating element, at least the surface of which is composed of platinum, disposed in said vacuum chamber, is heated at a prescribed temperature and a cleaning gas which is decomposed and/or activated by the heating element to generate an activated species that converts the deposited film into gaseous substance is introduced into the chamber.

6 Claims, 2 Drawing Sheets

HOT ELEMENT CVD APPARATUS AND A METHOD FOR REMOVING A DEPOSITED FILM

BACKGROUND OF THE INVENTION

1. Field of the Invention

This invention relates to a CVD apparatus for forming a film by using a hot element set at a prescribed temperature and a method for removing a deposited film, and particularly to a hot element CVD apparatus in which an in-situ cleaning is applied to and its cleaning method.

2. Description of the Invention

In the manufacturing process of semiconductor devices such as an LSI (large scale integrated circuit), display devices such as an LCD (liquid crystal display) and the like, a chemical vapor deposition (CVD) method is widely used for forming a variety of thin films on a substrate.

As such a CVD method, a plasma CVD method which utilizes a plasma to decompose and/or activate a material gas to form a film on a substrate and a thermal CVD method which utilizes the heat of a substrate to cause a reaction of a material gas and form a film on a substrate are well know. In addition to these methods, there is another CVD method in which a material gas is decomposed and/or activated to form a film by a hot element set at a prescribed high temperature. This CVD method is called "a hot element CVD method" hereinafter.

A CVD apparatus to carry out this method is constructed so that a hot element made of a metal having a high melting point such as tungsten and a substrate are disposed in a processing vacuum chamber, and a material gas is introduced into the chamber while the hot element is maintained at a temperature of about 1000–1800° C. The material gas introduced in the chamber is decomposed and/or activated to generate activated species when passing over the surface of the hot element. The activated species reaches the substrate and forms a thin film on the surface of the substrate. Of such a hot element CVD method, one using a wire as a hot element is referred to as a Hot-Wire CVD method, and one that is thought to be utilizing the catalytic reaction of a hot element in decomposition or activation process of the material gas is referred to as a Catalytic-CVD (or cat-CVD) method.

In the hot element CVD method, the decomposition or activation reaction of the material gas occurs when the gas passes over the surface of the hot element. Therefore, the substrate temperature can be lowered as compared with a thermal CVD method in which such a reaction is caused to occur only by the heat of the substrate. And unlike a plasma CVD method, the substrate is free from the damages caused by plasma. For these reasons, the hot element CVD method is expected to be a promising film forming method of semiconductor devices and display devices of the next generation, which will have higher integration and higher functions.

As the film formation is made on a substrate, a film is also deposited on the inner structures of the film forming apparatus in any film forming method including CVD methods mentioned above. The film deposited on the inner structures peels off when it becomes thick, which produces particles. The particles thus produced may be incorporated in the film on the substrate or adhere to the surface of the film, which causes the defect in the device and reduces production yield of the device.

In order to avoid these problems, the deposited film on the inner structures should be periodically removed before peeling off in the repetition of film formation.

One method often used for preventing the generation of particles due to the peeling-off of the deposited film is to cover the inner surfaces of the apparatus with sheets or members on which the films can be deposited instead of on inner surfaces in the apparatus, and to periodically exchange these sheets or members. However, since the deposition takes place even inside the narrow gaps of inner structure or on the hidden side of the sheets or members in the case of, e.g., the CVD apparatus. It is impossible to completely prevent the generation of particles.

In contrast, as a method for removing a film deposited inside the film forming chamber, there is a method called an in-situ cleaning method in which a cleaning gas is introduced into the chamber and is made to react with deposited films with the aid of energy of plasma or heat to generate gaseous substances which can be exhausted.

Since the in-situ cleaning method is carried out without exposing the inside of the chamber to the atmosphere, the continuous and stable production of thin films having a prescribed characteristic becomes available. In addition, since neither the exchange of the sheets or members nor the operation of exhausting the chamber from the atmospheric pressure to a prescribed pressure is necessary, the time for the cleaning process is remarkably shortened. Thus, this method has an advantage in increasing the productivity.

Moreover, this method makes it possible to remove even the film deposited inside the narrow gaps and effectively suppress the generation of particles.

When the in-situ cleaning method is applied to a plasma CVD apparatus used for forming, for example, a silicon film or a silicon nitride film, a cleaning gas such as $NF_3$, $CF_4$ or $CCl_4$ is introduced into the processing chamber and the plasma is generated at a proper time after the film formation has been repeatedly carried out. The cleaning gas is decomposed and/or activated by the plasma to react with a deposited film. A silicon film is converted to silicon tetrafluoride ($SiF_4$) or silicon tetachloride ($SiCl_4$) and a silicon nitride film is to $SiF_4$ or $SiCl_4$ and nitrogen ($N_2$). Since these gaseous substances are to be exhausted, the deposited film, consequently, can be removed.

In contrast, when a cleaning gas such as $ClF_3$ that is easily decomposed by heat is employed, plasma is not necessary. The deposited film can also be converted to gaseous substances merely by heating the chamber. However, the chamber must be heated above 200° C. in order to obtain a practical removal rate, which may cause the degradation of vacuum seals and substantially lengthens the cleaning time because it takes long time to heat and cool the chamber.

As has been mentioned, the in-situ cleaning of the film forming chamber is a very important process that is used to stabilize and continuously form a film with prescribed characteristics. Therefore, the present inventor attempted to apply the in-situ cleaning method to a promising hot element CVD apparatus and found that the convention in-situ cleaning methods have a problem in that a hot element made of metal having a high melting point reacts with the cleaning gas, and the wire becomes thin. That is, in this attempt, there were placed electrodes for the plasma generation in the processing chamber, the cleaning gas was introduced and then plasma is generated to carry out the cleaning. Although the deposited film could be removed, the hot element was also etched so that its diameter decreases. As a result, the prescribed exothermic characteristics could not be obtained in the next film formation.

A $ClF_3$ gas as a cleaning gas was introduced into the film forming chamber which was heated to 200° C. by using a heater installed outside. The hot element similarly reacted with the cleaning gas and its diameter decreased.

Thus, conventional in-situ cleaning methods cannot be directly applied to a hot element CVD apparatus. However, since in-situ cleaning is desired for the continuous and stable production of films, further examination on the structure of the hot element CVD apparatus and the cleaning condition were made to establish the in-situ cleaning technology is applicable to the hot element CVD apparatus.

SUMMARY OF THE INVENTION

This invention has been completed for the first time based on the above-mentioned knowledge and discovery. An object of this invention is to provide a method for efficiently and completely removing a film deposited even on the surface of a member having a complicated shape without providing a heating means for heating the member.

Another object of this invention is to provide an in-situ cleaning method for a hot element CVD apparatus which enables removal of a film deposited inside the apparatus without allowing the inside of the apparatus to be exposed to the atmosphere. Another purpose of this invention is to provide a hot element CVD apparatus to which an in-situ cleaning is applied.

A method for removing a deposited film according to the present invention comprises a method for removing a film deposited inside a chamber, which chamber can be exhausted and/or have a member placed therein, wherein after said chamber is exhausted, a hot element, at least the surface of which is composed of platinum, disposed in said chamber, is heated to a prescribed temperature and a cleaning gas which is decomposed and/or activated by said hot element to generate an activated species that converts said film into a gaseous substance is introduced into said chamber.

The chamber is part of a CVD apparatus which decomposes and/or activates a material gas by said hot element and deposits a film containing at least one element of said material gas on a substrate.

By making the surface of a hot element with platinum, it becomes possible to substantially prevent the reaction of the cleaning gas with the hot element and therefore prevent any decrease in, e.g., the diameter of the hot element. Moreover, a hot element that is made of platinum at least at its surface, makes it possible to efficiently decompose and/or activate the cleaning gas and generate activated species at a relatively low temperature and thereby effectively remove films deposited inside the chamber. The activated species thus generated seems to have such a long lifetime that even films deposited on a complicated shape or the inside of the pipe can be removed. In addition, the in-situ cleaning which is desired for the continuous formation of films with high characteristics can be applied to a hot element CVD apparatus.

This invention also involves covering at least a part of the surface of the inner structure of said chamber with platinum.

The inner structures except for the hot element are corroded and etched by the cleaning gas. However, the corrosion of the inner structures does not influence the film forming performance or the removal performance of deposited films since these structures are generally very thick compared with a hot element. Nevertheless, if the performance of the inner structures such as a measurement element, a sensor and the like is deteriorated by the contact of the cleaning gas, it is desirable to cover these structures with platinum so as to prevent contact of these structures with the cleaning gas. A current lead member, for example, may also be covered with platinum when thin rod is used therefore.

In this invention, said cleaning gas comprises fluorine ($F_2$), chlorine ($Cl_2$), nitrogen trifluoride ($NF_3$), carbon tetrafluoride ($CF_4$), hexafluoroethane ($C_2F_6$), octafluoropropane ($C_3F_8$), carbon tetrachloride ($CCl_4$), pentafluorochloroethane ($C_2ClF_5$), trifluorochlorine ($ClF_3$), trifluorochloromethane ($CClF_3$), or sulfur hexafluoride ($SF_6$).

These gases are sufficiently decomposed and/or activated with the aid of a hot element set at a prescribed temperature, and convert the deposited films to gaseous substances, resulting in efficiently removing the deposited film.

A CVD apparatus of this invention comprises a hot element CVD apparatus for forming a film containing at least one element of a material gas on a substrate. The CVD apparatus includes a process chamber able to be exhausted, an inlet for material gas, and a hot element able to be set at a prescribed temperature disposed in said chamber. In use, said material gas is decomposed and/or activated by said hot element. At least the surface of said hot element is composed of platinum. The CVD apparatus also includes a gas supply system that supplies a cleaning gas which is decomposed and/or activated by said hot element to generate activated species which converts a film deposited inside said chamber to a gaseous substance which is removed without exposing the inside of said chamber to the atmosphere.

In this invention, the hot element is fabricated so as not to react with a cleaning gas. This makes it possible to carry out the cleaning only by introducing the cleaning gas and heating said hot element after film formations. Accordingly, an in-situ cleaning of the apparatus can be realized.

An electrode for plasma generation may be disposed in said chamber. Since the hot element will not react with a cleaning gas or plasma, a conventional plasma cleaning method can be employed. Moreover, in the decomposition or activation of the gas, both the plasma and the heat of the hot element may be simultaneously employed. This increases the degree of freedom of the film formation and cleaning conditions, and therefore contributes to further improvements of film characteristics and cleaning efficiency.

BRIEF DESCRIPTION OF THE DRAWINGS

The above mentioned and other features and objects of this invention, and the manner of attaining them, will become more apparent and the invention itself will be better understood by reference to the following description of the invention taken in conjunction with the accompanying drawings, wherein.

Figure 1:
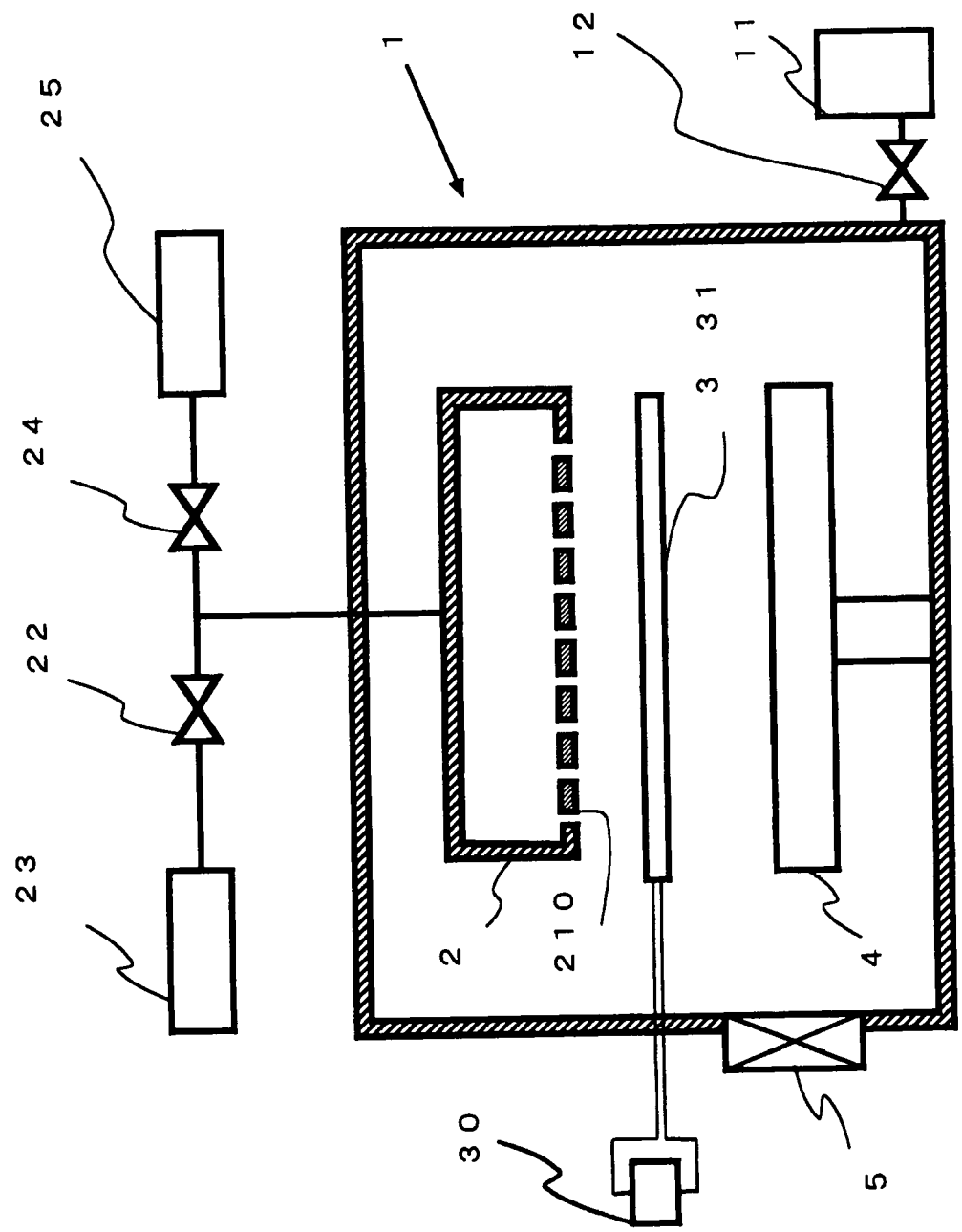
FIG. 1 is a conceptual diagram showing a configuration example of a film forming apparatus employing a hot element CVD method, in which apparatus an in-situ cleaning method according to the present invention is applied.

Corresponding reference characters indicate corresponding parts throughout the several views. Although the drawings represent embodiments of the present invention, the drawings are not necessarily to scale and certain features may be exaggerated in order to better illustrate and explain the present invention. The exemplification set out herein illustrates embodiments of the invention, in several forms, and such exemplifications are not to be construed as limiting the scope of the invention in any manner.

DETAILED DESCRIPTION OF THE PREFERRED EMBODIMENTS

The embodiments disclosed below are not intended to be exhaustive or limit the invention to the precise forms disclosed in the following detailed description. Rather, the embodiments are chosen and described so that others skilled in the art may utilize its/their teachings.

The preferred embodiments of this invention will be described below by referring to the accompanying drawings.

FIG. 1 is a conceptual diagram showing a structural example of a hot element CVD apparatus, in which apparatus an in-situ cleaning method according to the present invention is applied.

A film forming apparatus shown in FIG. 1 comprises a processing vacuum chamber 1, an exhaust system 11 for exhausting the processing vacuum chamber 1, gas supplying systems 23, 25 for supplying a material gas for the film formation and a cleaning gas, and a gate valve 5 through which a substrate is transferred. In processing vacuum chamber 1, surfaces of a gas supply vessel 2 connected with gas supply system 23, 25, a substrate holder 4, and a hot element 3, are made of platinum.

The introduction of a material gas and a cleaning gas to gas supply vessel 2 is switched by valves 22, 24. The feed rate of these gases is controlled by a respective flow controller (not illustrated) provided in each of gas supply systems 23, 25. Gas supply vessel 2 has a hollow structure and a plurality of gas outlets 210 in the plane that faces substrate holder 4. The exhaust system 11 is connected to processing vacuum chamber 1 through a main valve 12 having an exhaust speed regulation function by which the pressure inside the processing chamber is controlled.

A support member 31 holds hot element 3 that is connected to an energy supply mechanism 30 for controlling the temperature of hot element 3. As an energy supply mechanism, a DC or AC power source is, in general, employed. The hot element is heated and maintained at a prescribed temperature by an electric current to decompose and/or activate a material gas during a film formation process and a cleaning gas during a cleaning process, which efficiently brings about the film formation and the cleaning.

Figure 2:
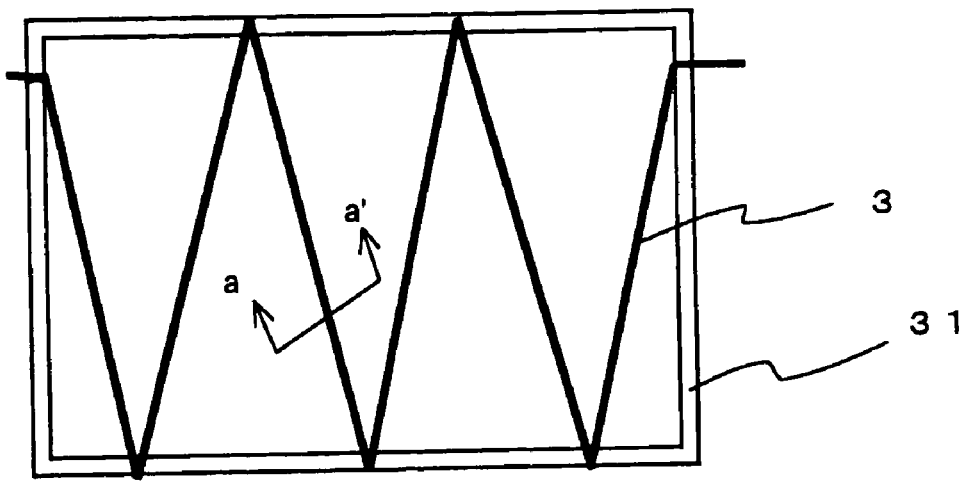
FIG. 2 is a conceptual plan view showing a configuration of hot element 3 shown in FIG. 1.

FIG. 2 is a conceptual plan view showing a configuration of hot element 3 shown in FIG. 1. In this case, hot element 3 is fabricated with a wire member formed in saw tooth shape and is held by a support member 31.

Figure 3:
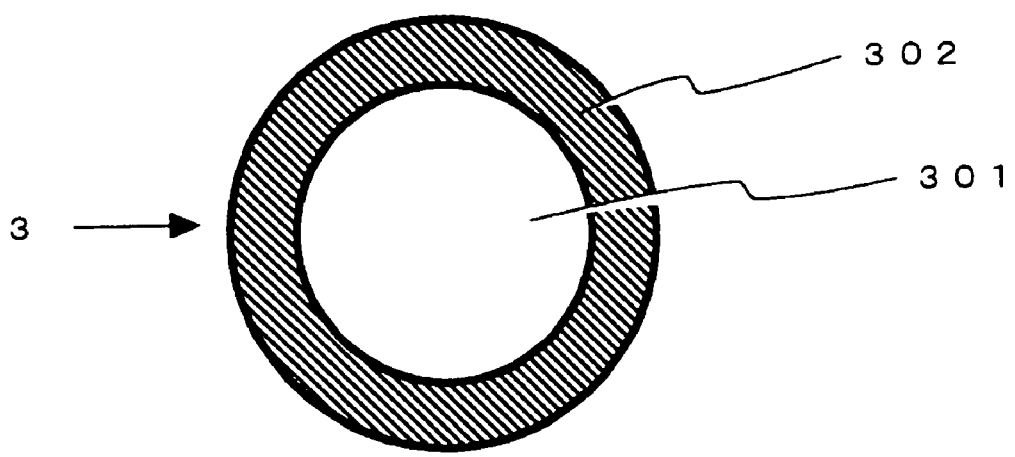
FIG. 3 is a sectional view of hot element 3 taken along the a—a' line.

The hot element that has a platinum layer on the surface of a substrate member is described in detail by referring to FIG. 3. FIG. 3 is a sectional view of hot element 3 taken along the a—a' line of FIG. 2.

As shown in FIG. 3, the hot element comprises a substrate member 301 and a coating layer 302 formed thereon. There is no particular restriction on the material of the substrate member, but a material which has a higher melting point than platinum is preferably employed such as tungsten, tantalum, niobium, carbon, iridium, molybdenum or rhodium, silicon carbide, PBN (pyrolitic boron nitride), alumina and the like. The coating layer 302 of platinum is formed by a method of electron-beam evaporation, sputtering, plating, lining or the like.

It is also possible to make whole hot element with platinum.

Next, the method of the film formation and the cleaning will be explained by using the apparatus shown in FIG. 1.

(Film Formation)

First, a substrate is transferred into processing vacuum chamber 1 through gate valve 5 from a load lock chamber (not illustrated) and is placed on substrate holder 4. After processing vacuum chamber 1 is evacuated to a prescribed pressure by exhaust system 11, energy is supplied to hot element 3 from a DC or AC power source as an energy supply mechanism 30 to maintain hot element at a prescribed temperature. This temperature is usually determined, depending on the type of a film to be formed and a material gas; for example, a temperature around 1000° C. is used for forming a silicon film with silane ($SiH_4$) and hydrogen ($H_2$).

Then, valve 22 is opened and the material gas is introduced into the processing vacuum chamber at a prescribed flow rate. The pressure inside the processing vacuum chamber is set at a prescribed pressure by the exhaust speed regulation function of main valve 12.

The material gas supplied into gas supply vessel 2 is blown off through gas outlets 210 in the direction of hot element 3, and is decomposed and/or activated by the catalytic action of the platinum of the hot element maintained at a high temperature to generate activated species. The activated species reaches the substrate and the film is deposited on it. When the thickness of the film on the substrate to reaches a predetermined value, the material gas and the energy to the hot element are cut off. After the chamber is evacuated, the substrate is carried to the load lock chamber through gate valve 5 to finish the film formation.

(Cleaning)

The repetitions of the film formation mentioned above also cause the film to be deposited on the inner surface of the processing vacuum chamber, the substrate holder, the gas supply vessel, the support member and the like. When this deposited film becomes thick, it will peel off to produce particles. The particles may be entrapped in the film during the film formation or may adhere to the surface of the film, which deteriorates the characteristics of the film or causes defects in devices. Therefore, the following cleaning treatment should be made before the film becomes thick and begins to peel off and produce particles. The film thickness of a deposited film may be monitored with the aid of an optical sensor or estimated from the total film forming time.

In the cleaning process, the processing vacuum chamber is evacuated by fully opening valve 12, and the hot element is heated up to a prescribed temperature and maintained at the temperature by the DC or AC power source 30. Next, valve 24 is opened and the cleaning gas is introduced into processing vacuum chamber 1. The pressure is set at a prescribed pressure by main valve 12.

The gas ejected from gas outlets 210 is effectively decomposed and/or activated by the platinum of the hot element which is maintained at a high temperature to generate activated species. For example, the hot element is preferably heated at 400° C. and 1000° C. or higher in the case of employing $NF_3$ and $CF_4$ as a cleaning gas, respectively. An activated species that is highly reactive with a deposited film can be generated by the catalytic action of the platinum. The platinum is stable against the activated species. Therefore, the stable film formation can be carried out even after the cleaning treatment. The activated species reacts with the films deposited on the surface of the inner wall, the substrate holder and the like and converts the films into gaseous substances. The films are gradually removed as the gaseous substance thus generated are evacuated outside by the exhaust system.

This condition is maintained until the deposited films are completely removed. Thereafter, the supply of the cleaning gas and the energy to the hot element are stopped, and the processing vacuum chamber is evacuated. The cleaning process is completed in this way.

The cleaning procedure in this embodiment is an example of the cleaning method of this invention. One point of this invention is to carry out the cleaning in such that a cleaning gas is introduced while the hot element is heated by introducing an electric current. Therefore, for example, any procedure or order of the valve operation and the pressure adjustment with valves 22, 24 and main valve 12 different from those mentioned in the embodiment can also be adopted, or a dummy substrate may be placed on substrate holder 4 in the cleaning process.

In addition, although the gas is introduced into the chamber through gas supply vessel 2 in FIG. 1, the cleaning gas can be introduced through a different route than that of a material gas or can be introduced through a nozzle.

The hot element can also be placed at different locations from that shown in FIG. 1, for example, inside the gas supply vessel.

Although the temperature of the objects to be treated such as the inner wall of processing chamber 1, substrate holder 4, and gas supply vessel 2 has not been mentioned in the above embodiment, such objects may be heated by a heater to increase the removal rate of deposited films and shorten the cleaning time, since the higher the temperature of these objects, the larger the reaction rate of the cleaning gas with deposited films.

On the other hand, deposited films can be removed without heating in such a short time as previously mentioned so that whether the objects are heated or not is a matter of choice of the cleaning condition.

Moreover, in the conventional method using a gas such as $ClF_3$, a processing vacuum chamber must be heated in order to obtain practical removal rate of deposited films. However, the heating treatment is not necessary in this invention as mentioned above, so that the time for heating and cooling the processing vacuum chamber which usually needs a long time can be omitted and therefore the substantial cleaning time can be remarkably shortened.

Hot element 3 is usually connected and fixed to current lead members (not illustrated) installed in the processing vacuum chamber. The current lead members are usually made of Mo or Cu and formed in rod or block shape. The electric current is applied to the hot element through current lead members from energy supply mechanism 30. The members react with the cleaning gas and are etched. However, this reaction will not influence the exothermic characteristic of the hot element at all since their cross sections are very large compared with that of the hot element.

It is possible to cover the surface of the current lead members with platinum to prevent the reaction with the cleaning gas. In this case, the coating of the platinum is made by a method of electron-beam evaporation, sputtering, plating, lining or the like in the same way as that used for the hot element.

The in-situ cleaning method of a hot element CVD apparatus has been described so far. The cleaning method of this invention is also available in the case of removing films deposited in other processing apparatuses or films deposited on various members. Here, the term "members" is meant to include a measuring instrument, a sensor, a valve and the like usually used in vacuum apparatuses.

Films adhered to the inside of a vacuum vessel, for example, are removed in the following way. A hot element, at least the surface of which is made of platinum, is installed in the vacuum vessel so that the element can be activated from outside. A cleaning gas inlet port is also provided to the vacuum vessel. A deposited film can be removed by heating the element to a prescribed temperature and introducing the cleaning gas into the vacuum vessel.

In the case of removing films deposited on members, the members are placed in such a vacuum vessel, and similar treatment is carried out. In the case of pipe with a considerable length, a hot element is placed at the upstream end of the pipe so that the gas is made flow inside the pipe. It is also possible to construct a vacuum vessel with pipes or members to be treated.

Even films deposited in narrow gaps of a member with complicated shapes or inside the pipe can be effectively removed by this invention as has been mentioned. This seems to be attributed to the activated species of cleaning gas that is generated to be very reactive and have a considerably long lifetime by a hot element made of platinum.

The removal method of the deposited film of this invention can be applied to various types of deposited films by appropriately selecting a cleaning gas and a cleaning condition. For example, when a cleaning gas containing fluorine or chlorine is used, various types of deposited films including metal films such as W, Ta and Ti can also be removed as well as semiconductors or insulators such as silicon, silicon carbide, and silicon nitride.

A cleaning gas is also selected according to the type of deposited film, the cleaning condition, or materials of the processing vacuum chamber. A fluorine- or chlorine-containing gas is suitably used. In particular, $NF_3$, $F_2$, $Cl_2$, $CF_4$, $C_2F_6$, $C_3F_8$, $CCl_4$, $C_2ClF_5$, $ClF_3$, $CClF_3$ or $SF_6$ is preferably used. The gas can be diluted by, e.g., Ar or He, or can be mixed for practical use.

A hot element is used in a variety of shapes such as a wire, rod, tube, plate, foil or the like. A wire may be further formed into coil or saw tooth shape.

In a hot element CVD apparatus of this invention, an electrode for plasma generation can be disposed inside the processing vacuum chamber. The plasma discharge of fluorine- or chlorine-containing cleaning gases can be made to occur in the cleaning process with the hot element heated by an electric current. The cleaning gas is decomposed and/or activated by the plasma, enabling removal of a film deposited inside the processing chamber. It is confirmed that the hot element of this invention does not practically react with plasma. Accordingly, an in-situ cleaning using plasma becomes available, in which the processing chamber does not need to be exposed to the atmosphere during the cleaning.

In addition, both the heating of the hot element and the plasma generation can be carried out at the same time in the film formation process and the cleaning process. The interaction of the heat by the hot element and the plasma further improves the film characteristics and the cleaning efficiency.

In the case of using $ClF_3$ as a cleaning gas and heating a processing chamber or a member to decompose the gas, an in-situ cleaning is also available so long as materials of the chamber or member to be treated permit since the hot element is stable against the $ClF_3$.

(Application to the Industry)

The present invention makes it possible to provide a method for effectively removing films deposited inside various film forming chambers and on the members by heating a hot element made of platinum at the surface to a prescribed temperature, and introducing a cleaning gas.

In addition, a hot element CVD apparatus which an in-situ cleaning is applied to is realized. As a result, a continuous production of thin films having high characteristics become available by a hot element CVD method which is expected to be a promising manufacturing means of high characteristic films.

Thus, the present invention contributes to further improvement of the characteristics and productivity of semiconductor devices and display devices, and also promotes their development.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A method for removing a deposited film from a wall inside a chamber, said method comprising:

providing a hot element, said hot element disposed away from said wall and said deposited film, said hot element having at least a surface which is composed of platinum;

heating said hot element to 400° C. or higher without generating a plasma;

supplying said chamber with a cleaning gas containing at least one of a fluorine atom and a chlorine atom, and first contacting said hot element with said gas to thereby activate said gas;

thereafter contacting the deposited film with said activated cleaning gas and converting said deposited film into a gaseous substance; and removing said gaseous substance from said chamber.

2. The method according to claim 1, wherein said chamber comprises a CVD apparatus and the method further comprises:

heating the hot element;

supplying a material gas to the chamber;

contacting the material gas with the hot element to cause decomposition and/or activation of the material gas by said hot element; and forming the deposited film which comprises at least one element from said material gas on a substrate.

3. The method according to claim 2, wherein at least a part of the surface of an inner structure of said chamber is covered with platinum.

4. The method according to claim 2, wherein said cleaning gas is a gas containing at least one of fluorine ($F_2$), chlorine ($Cl_2$), nitrogen trifluoride ($NF_3$), carbon tetrafluoride ($CF_4$), hexafluoroethane ($C_2F_6$), octafluoropropane ($C_3F_8$), carbon tetrachloride ($CCl_4$), pentafluorochloroethane ($C_2ClF_5$), trifluorochlorine ($ClF_3$), trifluorochloromethane ($CClF_3$), sulfur hexafluoride ($SF_6$), and mixtures thereof.

5. The method according to claim 1, wherein at least a part of a surface of an inner structure of said chamber is covered with platinum.

6. The method according to claim 1, wherein said cleaning gas is a gas containing at least one of fluorine ($F_2$), chlorine ($Cl_2$), nitrogen trifluoride ($NF_3$), carbon tetrafluoride ($CF_4$), hexafluoroethane ($C_2F_6$), octafluoropropane ($C_3F_8$), carbon tetrachloride ($CCl_4$), pentafluorochloroethane ($C_2ClF_5$), trifluorochlorine ($ClF_3$), trifluorochloromethane ($CClF_3$), and sulfur hexafluoride ($SF_6$), and mixtures thereof.

* * * * *

UNITED STATES PATENT AND TRADEMARK OFFICE
CERTIFICATE OF CORRECTION

PATENT NO. : 6,942,892 B1
DATED : September 13, 2005
INVENTOR(S) : Keiji Ishibashi It is certified that error appears in the above-identified patent and that said Letters Patent is hereby corrected as shown below:

Title page,
Item [73], Assignee, add -- Japan Science and Technology Corporation, Saitama Japan --.

Signed and Sealed this

Twenty-fourth Day of January, 2006

JON W. DUDAS
*Director of the United States Patent and Trademark Office*